United States Patent [19]

Dosaka et al.

[11] Patent Number: 4,837,747

[45] Date of Patent: Jun. 6, 1989

[54] REDUNDARY CIRCUIT WITH A SPARE MAIN DECODER RESPONSIVE TO AN ADDRESS OF A DEFECTIVE CELL IN A SELECTED CELL BLOCK

[75] Inventors: Katsumi Dosaka; Masaki Kumanoya; Hideshi Miyatake; Hideto Hidaka; Yasuhiro Konishi; Hiroyuki Yamasaki; Yuto Ikeda; Kazuhiro Tsukamoto; Masaki Shimoda, all of Hyogo, Japan

[73] Assignee: Mitsubishi Denki Kabushiki Kaisha, Tokyo, Japan

[21] Appl. No.: 126,349

[22] Filed: Nov. 30, 1987

[30] Foreign Application Priority Data

Nov. 29, 1986 [JP] Japan .................. 61-284848
Dec. 22, 1986 [JP] Japan .................. 61-307139

[51] Int. Cl.$^4$ .................. G11C 7/00; G11C 29/00; G11C 8/00
[52] U.S. Cl. .................. 371/10; 365/230.03; 365/189.05; 365/210; 365/200; 365/230.06
[58] Field of Search .............. 365/230, 233, 210, 200, 365/189; 371/10

[56] References Cited

U.S. PATENT DOCUMENTS

| | | | |
|---|---|---|---|
| 4,389,715 | 6/1983 | Eaton, Jr. et al. ............... | 365/200 X |
| 4,547,867 | 10/1985 | Reese et al. ...................... | 365/189 X |
| 4,556,975 | 12/1985 | Smith et al. ........................ | 365/200 |
| 4,601,019 | 7/1986 | Shah et al. ......................... | 365/230 |
| 4,639,895 | 1/1987 | Iwahashi et al. ................ | 365/200 X |
| 4,648,075 | 3/1987 | Segawa et al. ................... | 365/200 X |
| 4,727,516 | 2/1988 | Yoshida et al. .................. | 365/200 X |

OTHER PUBLICATIONS

ISSCC 83, Feb. 23, 83, CMOS Memory, Digest of Technical Papers "A 64kbf.CMOS RAM with Divided WL Structure", by Yoshimoto et al., pp. 58–59.
*Electronics*, Posa, John G.: "Redundancy", Jul. 28, 1981, pp. 116–134.
*IEEE Journal of Solid-State Circuits*, Robert T. Smith et al., "Laser Programmable Redundancy and Yield, Improvement in a 64K DRAM", vol. SC-16, No. 5, Oct. 1981.
*IEEE Journal of Solid State Circuits*, Kim C. Hardee et al., "A Fault-Tolerant 30 ns/375 mW 16K x 1 NMOS Static Ram."

*Primary Examiner*—Stuart N. Hecker
*Assistant Examiner*—Alfonso Garcia
*Attorney, Agent, or Firm*—Lowe, Price, LeBlanc, Becker & Shur

[57] ABSTRACT

A memory cell array is divided into four blocks #1 to #4. The blocks #1 and #3 are operated when a row address signal $RA_8$ equals "0". The blocks #2 and #4 are operated when the row address signal $RA_8$ equals "1". A spare row sub-decoder is provided in each of the blocks. Spare row sub-decoders in the blocks #1 and #2 are connected to a spare row main decoder through a single spare decoder selecting line. The spare row sub-decoders in the blocks #2 and #4 are connected to the other spare row main decoder through another spare decoder selecting line. The spare main decoders are responsive to the row address signal $RA_8$ and row address signals $RA_2$, $\overline{RA_2}$, ..., $RA_7$, $\overline{RA_7}$ for operating a spare row sub-decoder in a block which is in the operating state.

18 Claims, 12 Drawing Sheets

FIG. 5 PRIOR ART

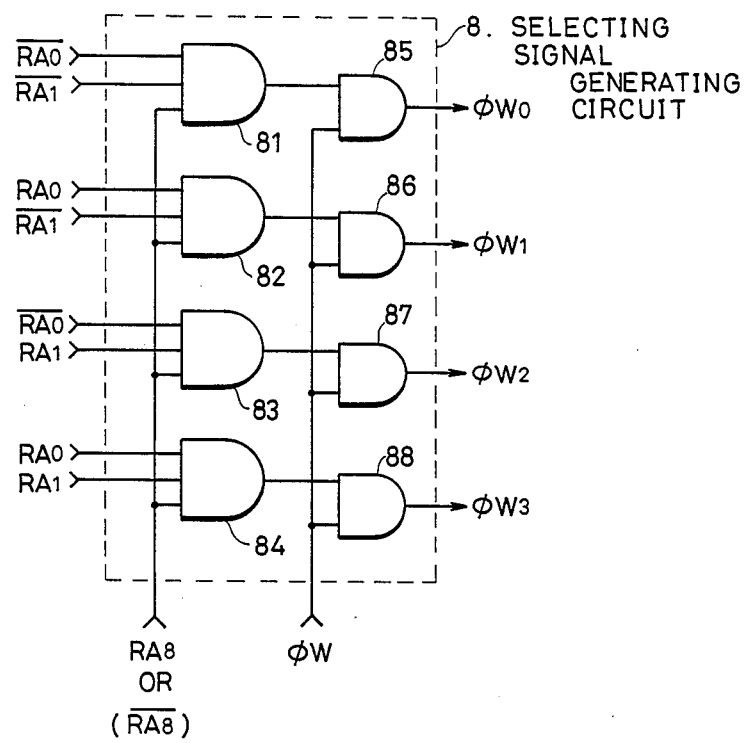

FIG. 6 PRIOR ART $Y_0 = \overline{CA_1} \cdot \overline{CA_2}$   $Y_8 = \overline{CA_5} \cdot \overline{CA_6}$ $Y_1 = CA_1 \cdot \overline{CA_2}$   $Y_9 = CA_5 \cdot \overline{CA_6}$ $Y_2 = \overline{CA_1} \cdot CA_2$   $Y_{10} = \overline{CA_5} \cdot CA_6$ $Y_3 = CA_1 \cdot CA_2$   $Y_{11} = CA_5 \cdot CA_6$ $Y_4 = \overline{CA_3} \cdot \overline{CA_4}$   $Y_{12} = \overline{CA_7} \cdot \overline{CA_8}$ $Y_5 = CA_3 \cdot \overline{CA_4}$   $Y_{13} = CA_7 \cdot \overline{CA_8}$ $Y_6 = \overline{CA_3} \cdot CA_4$   $Y_{14} = \overline{CA_7} \cdot CA_8$ $Y_7 = CA_3 \cdot CA_4$   $Y_{15} = CA_7 \cdot CA_8$

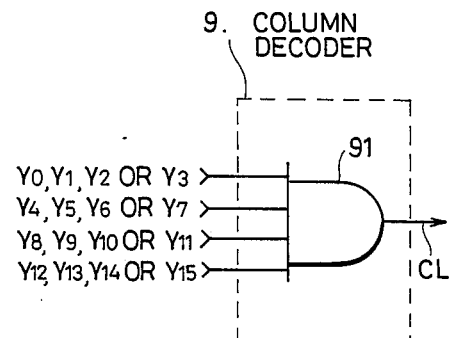

REDUNDARY CIRCUIT WITH A SPARE MAIN DECODER RESPONSIVE TO AN ADDRESS OF A DEFECTIVE CELL IN A SELECTED CELL BLOCK

BACKGROUND OF THE INVENTION

1. Field of the Invention

The present invention relates to a semiconductor memory device comprising a programmable redundancy circuit and more particularly, to a structure of a redundancy decoder (spare decoder).

2. Description of the Prior Art

Recently, in a high integrated memory device such as a dynamic MOS.RAM (Metal Oxide Semiconductor Random Access Memory), it has been desired to reduce power consumption with the development of high integration. In the dynamic MOS.RAM, a bit line charging and discharging current occupies a large amount of the total consumed current. Thus, recently, in each active cycle, only a memory cell array block related to an input address is operated and the other memory cell array blocks are not operated so that the bit line charging and discharging current of the bit line is reduced to half or three-fourths.

FIG. 1 is a block diagram showing a conventional example of, for example, a 1M-bit dynamic MOS.RAM comprising a block partitioned memory cell array.

The dynamic MOS.RAM shown in FIG. 1 is divided into four blocks #1 to #4. Each of the blocks #1 to #4 comprises two memory cell arrays 1a and 1b. The memory cell arrays 1a and 1b comprise spare rows 2a and 2b and spare columns 3a and 3b, respectively. Row sub-decoders 4 and row main decoders 5 are arranged on one side of each of the memory cell arrays 1a and 1b. Spare row sub-decoders 6a and 6b are arranged in respective one ends of the spare rows 2a and 2b. Four spare row main decoders 7 corresponding to the blocks #1 to #4 are arranged in the vicinity of the block #1. Each of the spare row main decoders 7 is connected to the spare row sub-decoders 6a and 6b in a corresponding one of the blocks #1 to #4 through a spare decoder selecting line L. A column decoder 9 is arranged between the memory cell arrays 2a and 2b in each of the blocks #1 to #4. A spare column decoder 10 is arranged between the spare columns 3a and 3b in each of the blocks #1 to #4.

In the dynamic MOS.RAM, any of the blocks #1 to #4 is selected by a combination of a row address signal $RA_8$ and a row address signal $RA_9$. In addition, either of the memory cell arrays 1a and 1b is selected by a column address signal $CA_9$. For example, when $RA_8$ equals 0, $RA_9$ equals 0 and $CA_9$ equals 0, the memory cell array 1a in the block #1 is selected. Row address signals $RA_0, \overline{RA_0}, \ldots, \overline{RA_9}$ and column address signals $CA_0, \overline{CA_0}, \ldots, \overline{CA_9}$, are generated from an address buffer circuit 30.

FIG. 2 is a diagram showing a structure of a memory cell array 1a and the peripheral portion included in any of blocks.

A memory cell array 1a comprises a plurality of word lines WL and a plurality of pairs of bit lines BL and $\overline{BL}$ intersecting with the word lines WL. The memory cell array 1a also comprises a plurality of memory cells MC each provided at an intersection of each of the word lines WL and one, BL or $\overline{BL}$, of each of the bit line pairs. In addition, the memory cell 1a includes a spare row 2a comprising four spare word lines SWL and a spare column 3a comprising two spare bit line pairs SBL and $\overline{SBL}$. A spare memory cell SMC is provided at an intersection of each of the spare word lines SWL and the bit line BL or $\overline{BL}$ or one, SBL or $\overline{SBL}$, of each of the spare bit line pairs. The spare memory cell SMC is also provided between each of the word lines WL and the spare bit line SBL or $\overline{SBL}$. A plurality of word lines WL are connected to row sub-decoders 5 in such a manner that each four word lines WL are connected to a corresponding sub-decoder 4. The row sub-decoders 5 are connected to row main decoders 4, respectively. Four word lines SWL are connected to a spare sub-decoder 6a. Selecting signals $\Phi W_0$ to $\Phi W_3$ are applied to the row sub-decoders 5 and the spare sub-decoder 6a from a selecting signal generating circuit 8. The bit line pairs BL and $\overline{BL}$ and the spare bit line pairs SBL and $\overline{SBL}$ which are in odd numbers are connected to a pair of input/output lines $I/O_0$ and $\overline{I/O_0}$ through sense amplifiers SA and transistors Q1 and Q2. In addition, the bit line pairs BL and $\overline{BL}$ and the spare bit line pairs SBL and $\overline{SBL}$ which are in even numbers are connected to a pair of input/output lines $I/O_1$ and $\overline{I/O_1}$ through sense amplifiers SA and transistors Q1 and Q2. Each of the transistors Q1 and Q2 corresponding to two adjacent bit line pairs BL and $\overline{BL}$ has a gate connected to a column decoder 9 through a column selecting line CL. Each of the transistors Q1 and Q2 corresponding to two adjacent spare bit line pairs SBL and $\overline{SBL}$ has a gate connected to a spare column decoder 10 through a spare column selecting line SCL. The pairs of input/output lines $I/O_0$ and $\overline{I/O_0}$ and the pairs of input/output lines $I/O_1$ and $\overline{I/O_1}$ are connected to an input/output circuit 20 through preamplifiers PA, respectively.

A memory cell array 1b, which is not shown in FIG. 2, and the memory cell array 1a are symmetric with respect to the column decoders 9.

Description is now made on operation of the memory cell array shown in FIG. 2. Any of the row main decoders 4 is selected in response to row address signals $RA_2, \overline{RA_2}, \ldots, \overline{RA_7}$. A row sub-decoder 5 connected to the selected row main decoder 4 is responsive to the selecting signals $\Phi W_0$ to $\Phi W_3$ for selecting any of the four word lines WL. Therefore, information stored in memory cells MC connected to the selected word line WL are read out to each of the bit lines BL and $\overline{BL}$ and amplified by a sense amplifier SA. Any of the column decoders 9 is then selected in response to address signals $Y_0$ to $Y_{15}$. The address signals $Y_0$ to $Y_{15}$ are formed based on column address signals $CA_1, \overline{CA_1}, \ldots, \overline{CA_7}$. The selected column decoder 9 outputs a column selecting signal to the column selecting line CL. Therefore, two pairs of transistors Q1 and Q2 connected to the column selecting line CL are turned on, so that information on two pairs of bit lines BL and $\overline{BL}$ are read out to the pair of input/output lines $I/O_0$ and $\overline{I/O_0}$ and the pair of input/output lines $I/O_1$ and $\overline{I/O_1}$, respectively, and amplified by preamplifiers PA. The input/output circuit 20 is responsive to column address signals $CA_0$ and $\overline{CA_0}$ for reading out either of information on the pair of input/output lines $I/O_0$ and $\overline{I/O_0}$ or the pair of input/output lines $I/O_1$ and $\overline{I/O_1}$ to a data bus. The above described operation is performed in the same manner, in the memory cell arrays 1a and 1b.

Meanwhile, a defective memory cell may be formed in the manufacturing process. In this case, the spare row 2a is selected in place of a row including the defective memory cell. More specifically, when a row address signal for selecting the row including the defective memory cell is applied, not a corresponding row main decoder 4 but the spare row main decoder 7 (in FIG. 1) is selected. The spare row sub-decoder 6a connected to the spare row main decoder 7 is responsive to the selecting signals $\Phi W_0$ to $\Phi W_3$ for selecting any of the four spare word lines SWL.

On the other hand, if and when a defective memory cell is formed, not a column including the defective memory cell but the spare column 3a may be selected. More specifically, when a column address signal for selecting the column including the defective memory cell is applied, the spare column decoder 10 is selected in place of a corresponding column decoder 9.

FIG. 3 is a circuit diagram showing an example of structures of a row main decoder 4 and a row sub-decoder 5.

The row main decoder 4 comprises an AND gate 41 having a plurality of input terminals. Row address signals $RA_2$ or $\overline{RA_2}, \ldots, RA_7$ or $\overline{RA_7}$ are applied to the input terminals of the AND circuit 41, respectively. The row sub-decoder 5 comprises four AND circuits 51 to 54. Each of the AND circuits 51 to 54 has one input terminal connected to an output terminal of the AND circuit 41. The AND circuits 51 to 54 have other input terminals receiving selecting signals $\Phi W_1$ to $\Phi W_3$ by a selecting signal generating circuit 8 as described below, respectively. The AND circuits 51 to 54 have output terminals connected to word lines WL, respectively.

When all of row address signals applied to the input terminals of the AND circuit 41 attain a high level (an "H" level), an output of the AND circuit 41 attains the "H" level. At that time, when any of the selecting signals $\Phi W_0$ to $\Phi W_3$ attains the "H" level, outputs of the AND circuits 51 to 54 receiving the selecting signals attain the "H" level. Therefore, one of the word lines WL is selected.

FIG. 4 is a circuit diagram showing an example of structures of a spare row main decoder 7 and a spare row sub-decoder 6a.

The spare row main decoder 7 comprises an address selector 71 and an AND circuit 72. The address selector 71 comprises a plurality of input terminals receiving row address signals $RA_2, \overline{RA_2}, \ldots, RA_7, \overline{RA_7}$, and a plurality of output terminals outputting the row address signals $RA_2$ or $\overline{RA_2}, \ldots, RA_7$ or $\overline{RA_7}$. The address selector 71 comprises a plurality of fuse-links. A row address signal provided to each of the output terminals is selected depending on whether or not the fuse-links are melted. The address selector 71 is set to output the same row address signal as that applied to a row main decoder 4 for selecting a row including a defective memory cell. The AND circuit 72 has input terminals receiving the row address signals outputted from the address selector 71. The AND circuit 72 has an output terminal connected to a spare decoder selecting line L. The spare row sub-decoder 6a comprises four AND circuits 61 to 64. Each of the AND circuits 61 to 64 has one input terminal connected to the spare decoder selecting line L. The AND circuits 61 to 64 have other input terminals receiving selecting signals $\Phi W_0$ to $\Phi W_3$ by a selecting signal generating circuit 8 as described below, respectively. Each of the AND circuits 61 to 64 has an output terminal connected to a spare word line SWL. The spare row sub-decoder 6a for a memory cell array 1a and a spare row sub-decoder 6b for a memory cell array 1b are connected to a single spare row main decoder 7 through the spare decoder selecting line L. In FIG. 4, only the spare row sub-decoder 6a is illustrated.

When all of the row address signals applied to the input terminals of the AND circuit 72 attain the "H" level, an output of the AND circuit 22 attains the "H" level. At that time, when any of the selecting signals $\Phi W_0$ to $\Phi W_3$ attains the "H" level, outputs of the AND circuits 61 to 64 receiving the selecting signals attain the "H" level, whereby only one of the spare word lines SWL is selected.

FIG. 5 is a circuit diagram showing an example of a structure of a selecting signal generating circuit 8.

The selecting signal generating circuit 8 comprises four AND circuits 81 to 84 each having three inputs and four AND circuits 85 to 88 each having two inputs. Each of the AND circuits 81 to 84 has an input terminal receiving a row address signal $RA_0$ or $\overline{RA_0}$, and other input terminal receiving a row address signal $RA_1$ or $\overline{RA_1}$. Each of the AND circuits 81 to 84 has remaining one input terminal receiving a row address signal $RA_8$ or $\overline{RA_8}$ common. The row address signal $RA_8$ is applied in the selecting signal generating circuit 8 in blocks #2 and #4, and the row address signal $\overline{RA_8}$ is applied in the selecting signal generating circuit 8 in blocks #1 and #3. Each of the AND circuits 85 to 88 has one input terminal receiving an output signal of each of the AND circuits 81 to 84 and other input terminal receiving a word line driving signal $\Phi W$ in common. Selecting signals $\Phi W_0$ to $\Phi W_3$ are derived from output terminals of the AND circuits 85 to 88, respectively.

Any of outputs of the AND circuits 81 to 84 attains an "H" level in response to the levels of the row address signals $RA_0, \overline{RA_0}, RA_1, \overline{RA_1}$ and $RA_8$. When the word line driving signal $\Phi W$ attains the "H" level, any of the selecting signals $\Phi W_0$ to $\Phi W_3$ attains the "H" level.

FIG. 6 is a circuit diagram showing an example of a structure of a column decoder 9.

The column decoder 9 comprises an AND circuit 91 having four inputs. The AND circuit 91 has one input terminal receiving any of address signals $Y_0, Y_1, Y_2$ and $Y_3$, other input terminal receiving any of address signals $Y_4, Y_5, Y_6$ and $Y_7$, other input terminal receiving any of address signals $Y_8, Y_9, Y_{10}$ and $Y_{11}$, and remaining one input terminal receiving any of address signals $Y_{12}, Y_{13}, Y_{14}$ and $Y_{15}$. The address signals $Y_0$ to $Y_{15}$ are obtained by decoding column address signals $CA_1, \overline{CA_1}, \ldots, CA_8$. The AND circuit 91 has an output terminal connected to a column selecting signal line CL. In the column decoder 9, when all of the address signals applied to the input terminals of the AND circuit 91 attain an "H" level, a column selecting signal at a high level is provided to the column selecting signal line CL.

FIG. 7 is a circuit diagram showing an example of a structure of a spare column decoder 10.

The spare column decoder 10 comprises a fuse latch 11, four address selectors 12 and an AND circuit 13. Each of the address selectors 12 has four input terminals receiving address signals and one output terminal, and derives from the output terminal any of the address signals applied to the input terminals. Address signals $Y_0$ to $Y_3, Y_4$ to $Y_7, Y_8$ to $Y_{11}$ and $Y_{12}$ to $Y_{15}$ are applied to the four address selectors 12, respectively. The AND circuit 13 has an input terminal receiving outputs of the fuse latch 11 and the four address selectors 12. The AND circuit 13 has an output terminal connected to a spare column selecting line SCL. Each of the address selectors 12 is set to output the same address signal as that applied to a column decoder 9 for selecting a column including a defective memory cell. In the spare column decoder 10, when the output of the fuse latch 11 attains an "H" level and all of the outputs of the four address selectors 12 attain the "H" level, a column selecting signal at a high level is provided to the spare column selecting line SCL.

FIG. 8 is a circuit diagram showing an example of a structure of the fuse latch 11 shown in FIG. 7.

The fuse latch 11 comprises a resistor R, a fuse-link FS, N channel MOSFETs (Metal Oxide Semiconductor Field Effect Transistor) Q11 and Q12 and a P channel MOSFET Q13. FIG. 8, the fuse-link FS is connected between a node N1 and a power supply terminal and the resistor R is connected between the node N1 and a ground terminal. In addition, the MOSFET Q11 is connected between the node N1 and the ground terminal. The MOSFET Q11 has a gate connected to a node N2. The MOSFET Q13 is connected between the power supply terminal and the node N2. The MOSFET Q13 has a gate connected to the node N1. The MOSFET Q12 is connected between the node N2 and the ground terminal. The MOSFET Q12 has a gate connected to the node N1.

In the fuse latch 11, since the resistance value of the fuse-link FS is lower than that of the resistor R when the fuse-link FS is not melted, a potential of the node N1 attains a high level, so that an output at a low level is derived from the node N2. When the fuse-link FS is melted by a laser or the like, the potential of the node N1 attains a low level, so that an output at a high level is derived from the node N2. The MOSFET Q11 prevents the node N1 from floating when the fuse-link FS is melted.

FIG. 9 is a circuit diagram showing an example of a structure of one of the address selectors 12 shown in FIG. 7.

Referring to FIG. 9, P channel MOSFETs Q21 and Q22 connected in series and N channel MOSFETs Q23 and Q24 connected in series are connected in parallel with each other between an input terminal I1 and an output terminal O1. In the same manner, P channel MOSFETs Q25 and Q26 and N channel MOSFETs Q27 and Q28 are connected to each other between an input terminal I2 and the output terminal O1. In the same manner, P channel MOSFETs Q29 and Q30 and N channel MOSFETs Q31 and Q32 are connected to each other between an input terminal I3 and the output terminal O1. In the same manner, P channel MOSFETs Q33 and Q34 and N channel MOSFETs Q35 and Q36 are connected to each other between an input terminal I4 and the output terminal O1. Each of the MOSFETs Q23, Q25, Q31 and Q33 has a gate receiving an output signal from a fuse latch 14. Each of the MOSFETs Q21, Q27, Q29, and Q35 has a gate receiving an output signal of an inverter 16 for inverting the output signal from the fuse latch 14. Each of the MOSFETs Q24, Q28, Q30 and Q34 has a gate receiving an output signal from a fuse latch 15. Each of the MOSFETs Q22, Q26, Q32 and Q36 has a gate receiving an output signal of an inverter 17 for inverting the output signal from the fuse latch 15. The structures of the fuse latches 14 and 15 are the same as that of the fuse latch 11 shown in FIG. 8. More specifically, when a fuse-link contained in each of the fuse latches 14 and 15 is not melted, the output signal of the fuse latch attains an "L" level. On the other hand, when the fuse-link is melted, the output signal thereof attains an "H" level.

When both of the fuse-links in the fuse latches 14 and 15 are being melted, the MOSFETs Q21, Q22, Q23, Q24, Q26, Q28, Q29 and Q31 are rendered conductive, so that an address signal $Y_{4i}$ (i=0, 1, 2, 3) applied to the input terminal I1 is transmitted to the output terminal O1. In the same manner, when only the fuse-link in the fuse latch 15 is melted, an address signal $Y_{4i+1}$ applied to the input terminal I2 is transmitted. When only the fuse-link in the fuse latch 14 is melted, an address signal $Y_{4i+2}$ applied to the input terminal I3 is transmitted. When neither of the fuse-links in the fuse latches 14 and 15 is melted, an address signal $Y_{4i+3}$ applied to the input terminal I4 is transmitted.

In the above described conventional dynamic MOS.-RAM, since the spare row main decoder 7 is larger, by the size of the address selector 71, than the nominal row main decoder 4 (see FIGS. 3 and 4), the spare row main decoder 7 is arranged in the peripheral circuit portion in many cases, as shown in FIG. 1. In this case, spare decoder selecting lines L connected between the spare row main decoder 7 and the spare row sub-decoders 6a and 6b are required, the number of which is the same as that of the spare row main decoders 7. Since the spare decoder selecting lines L are arranged at the side of the memory cell arrays 1a and 1b, the chip size is increased when the number of spare decoders is increased.

Furthermore, in the above described conventional dynamic MOS.RAM, since an address selector included in a spare decoder comprises a number of fuse-links and transfer gates which are disadvantageous for the pattern layout (see FIG. 9), the chip size is increased when the number of spare decoders is increased.

Examples of a circuit of a redundancy decoder and a circuit for replacing a defective memory cell with a spare memory cell are described in an article "REDUNDANCY", Electronics, July 28, 1981, pp. 116-134, an article "Laser Programmable Redundancy and Yield Improvement in a 64K DRAM", IEEE Journal of Solid State Circuits, Vol. SC-16, October, 1981, pp. 506-513, and an article "A Fault-Tolerant 30 ns/375 mW 16K×1 NMOS Static RAM", IEEE Journal of Solid State Circuits, Vol. SC-16, October, 1981, pp. 435-443.

SUMMARY OF THE INVENTION

A primary object of the present invention is to provide a semiconductor memory device capable of minimizing the increase in chip size due to the increase in number of spare decoders.

Another object of the present invention is to decrease the chip size by decreasing the number of interconnections connected between a spare main decoder and spare sub-decoders.

Still another object of the present invention is to decrease the chip size by simplifying the structure of an address selector included in each of the spare decoders.

In order to attain the above described objects, a semiconductor memory device comprising a programmable redundancy circuit according to the present invention comprises a plurality of memory cell array blocks each comprising a plurality of memory cells and at least one spare memory cell, block selecting means for generating a block selecting signal and a block non-selecting signal, each of the memory cell array blocks being selected by the block selecting signal and not selected by the block non-selecting signal, a plurality of decoders each provided in each of the memory cell array blocks and responsive to an address signals for selecting any of the memory cells, a plurality of spare sub-decoders each provided in each of the memory cell array blocks for selecting the spare memory cell in place of a defective memory cell when the defective memory cell exists in the memory cells, a spare main decoder arranged outside the memory cell array blocks, the spare main decoder being responsive to an address signal corresponding to a defective memory cell in a memory cell array block selected by the block selecting signal and the block selecting signal for generating a spare decoder selecting signal, a spare decoder selecting line connected between the spare main decoder and the memory cell array block receiving the block selecting signal and the memory cell array block receiving the block non-selecting signal for transmitting the spare decoder selecting signal generated by the spare main decoder to the memory cell array blocks, the spare sub-decoders being activated by the spare decoder selecting signal.

In the semiconductor memory device according to the present invention, since the spare sub-decoders in each of the plurality of memory cell array blocks which do not simultaneously enter the operating state and the spare main decoder are connected through a single spare decoder selecting line, the number of spare decoder selecting lines is decreased and the chip size is not so increased by the increase in number of spare decoders.

In accordance with another aspect of the present invention, a semiconductor memory device comprising a programmable redundancy circuit comprises a memory cell array including a plurality of memory cells and at least one spare memory cell, a decoder responsive to an address signal for selecting any of the memory cells, and a spare decoder responsive to an address signal for selecting a defective memory cell for selecting the spare memory cell when the defective memory cell exists in the memory cells, the spare decoder comprising a plurality of address selecting means and decoder means responsive to a predetermined combination of outputs from the plurality of address selecting means for generating a selecting signal for selecting the spare memory cell, each of the address selecting means comprising a plurality of buffer circuits receiving different address signals, an output terminal, and a plurality of link elements each connected between each of the buffer circuits and the output terminal and capable of being disconnected.

The semiconductor memory device according to the present invention, since the address selecting means included in each of the spare decoders comprises a plurality of buffer circuits and a plurality of link elements, the area can be decreased and the chip size is decreased.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram showing a structure of one of selecting signal generating circuits included in the dynamic MOS.RAM shown in FIG. 1;

FIG. 6 is a circuit diagram showing a structure of one of column decoders included in the dynamic MOS.RAM shown in FIG. 1;

DESCRIPTION OF THE PREFERRED EMBODIMENTS

Figure 10:
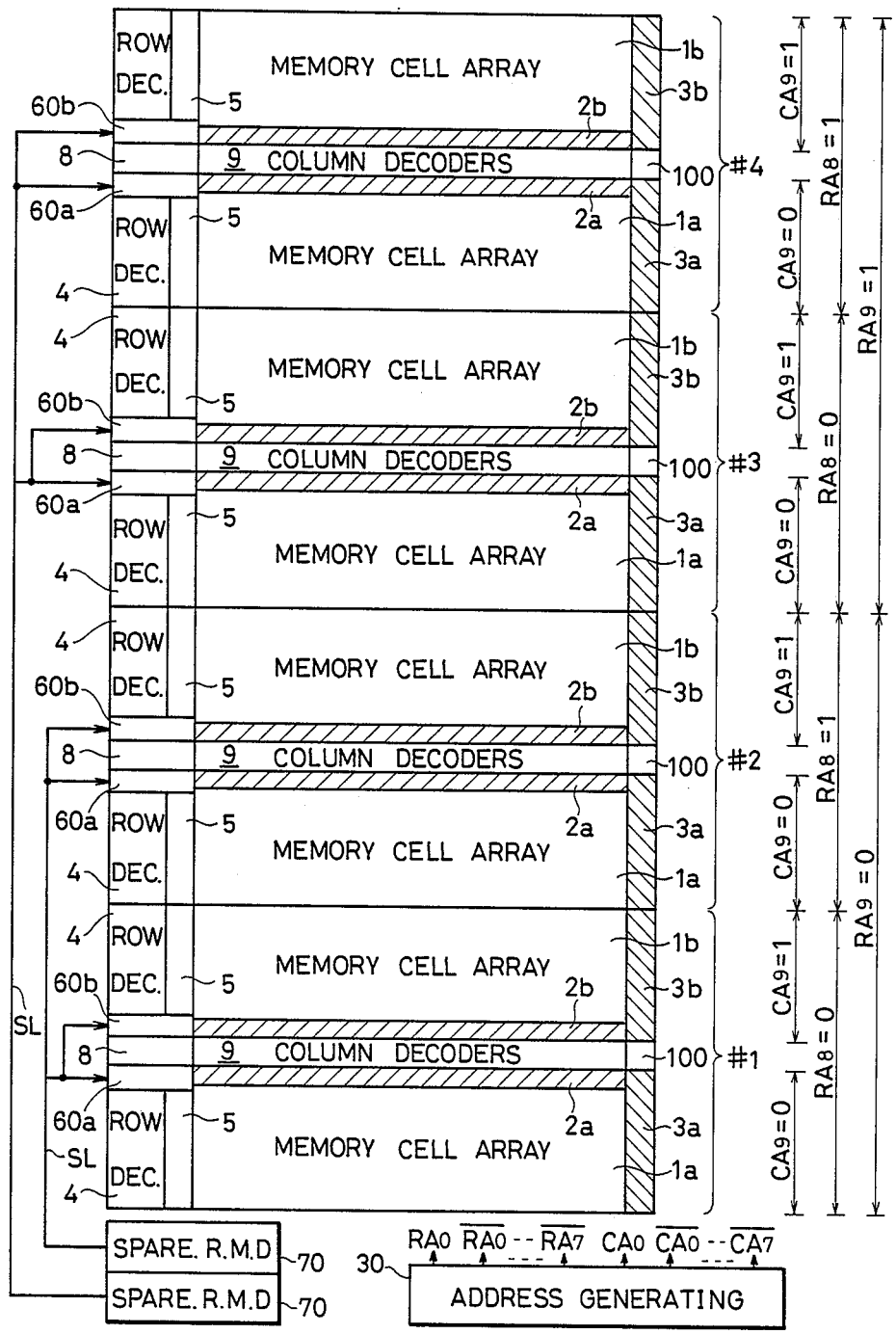
FIG. 10 is a diagram showing a specific structure of a dynamic MOS.RAM according to an embodiment of the present invention.

FIG. 10 is a diagram showing a specific structure of a dynamic MOS.RAM according to an embodiment of the present invention.

Figure 1:
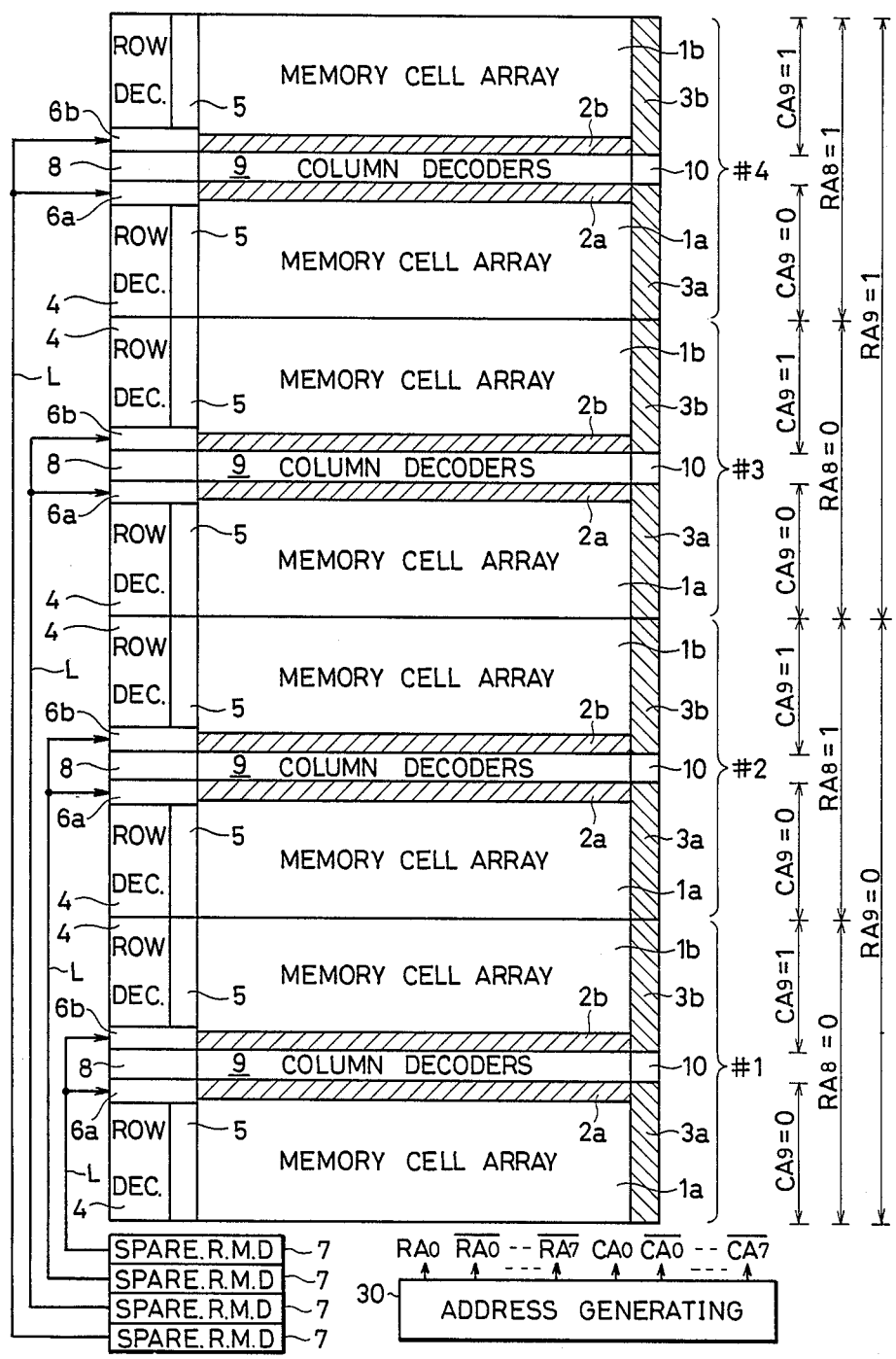
FIG. 1 is a diagram showing a specific structure of a conventional dynamic MOS.RAM comprising block partitioned memory cell arrays.
Figure 2:
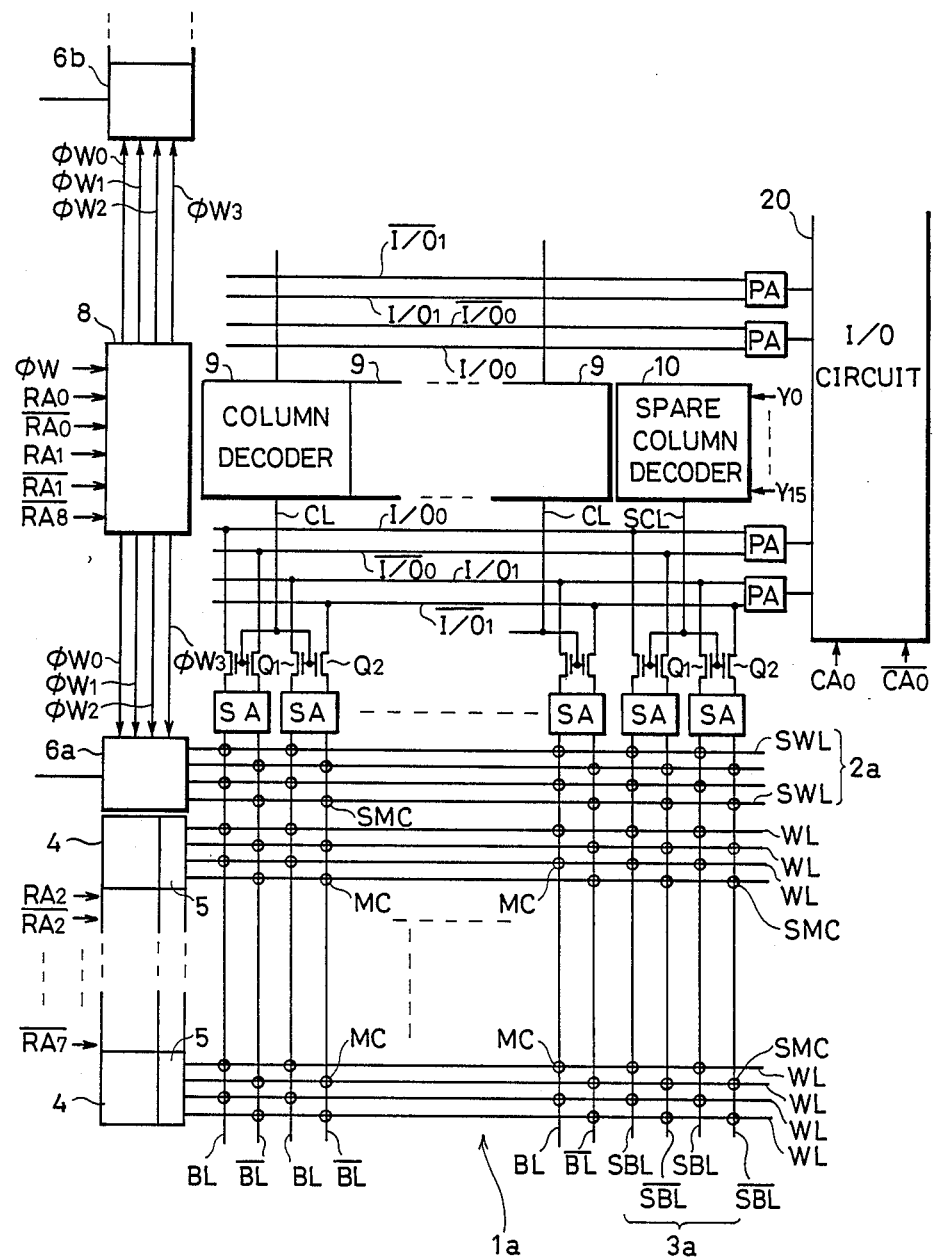
FIG. 2 is a circuit diagram showing a structure of one of the memory cell arrays included in the dynamic MOS.RAM shown in FIG. 1.
Figure 3:
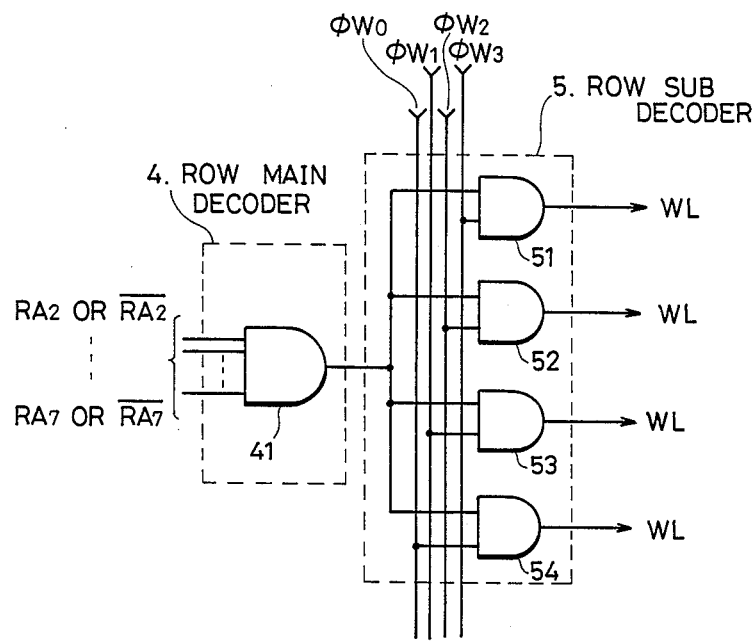
FIG. 3 is a circuit diagram showing structures of one of row main decoders and one of row sub-decoders included in the dynamic MOS.RAM shown in FIG. 1.
Figure 4:
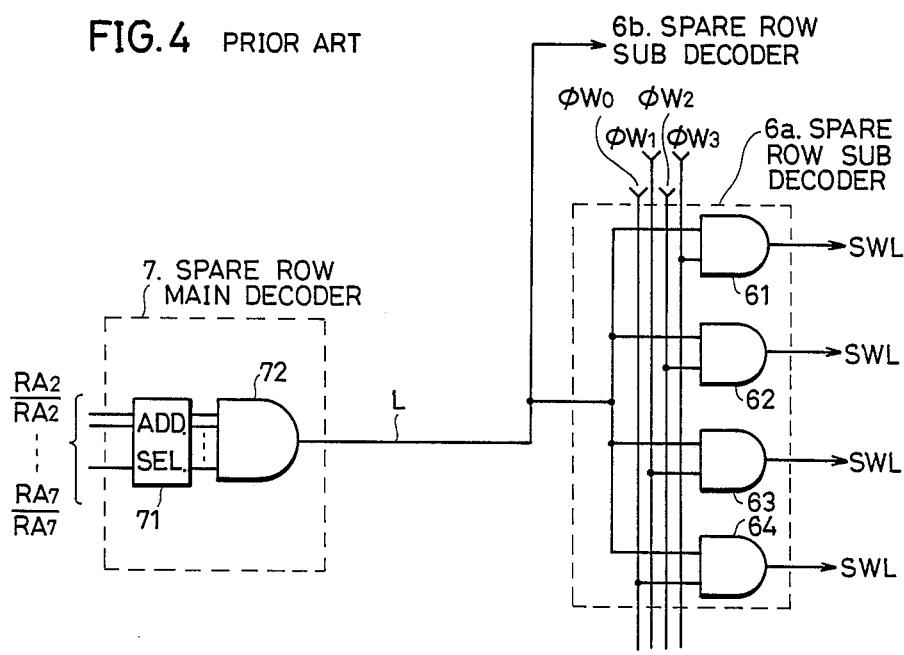
FIG. 4 is a circuit diagram showing structures of one of spare row main decoders and one of spare row sub-decoders included in the dynamic MOS RAM shown in FIG. 1.
Figure 7:
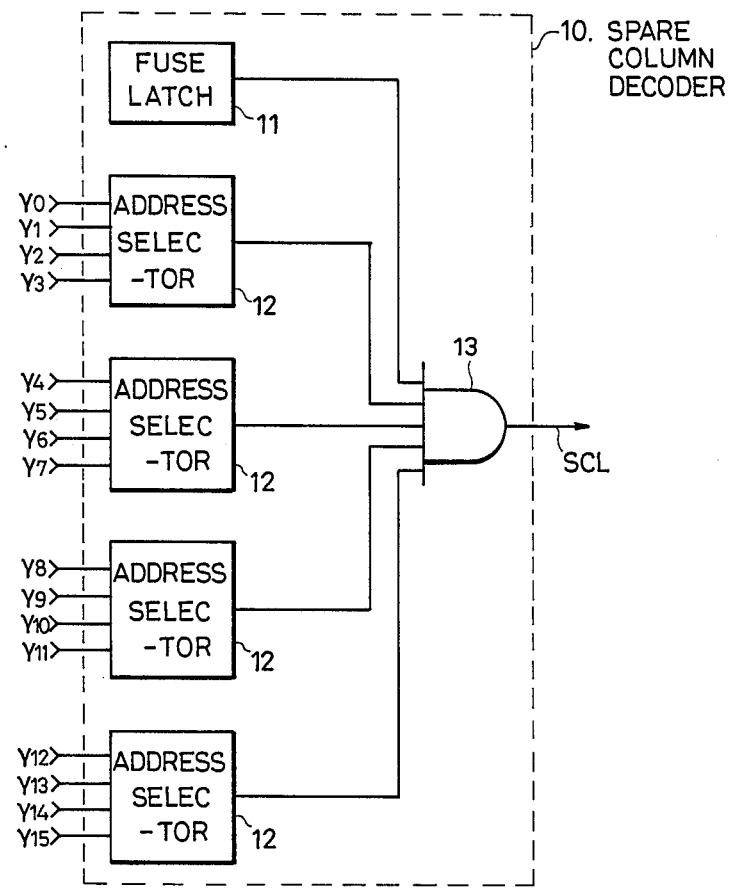
FIG. 7 is a circuit diagram showing a structure of one of spare column decoders included in the dynamic MOS.RAM shown in FIG. 1.

The dynamic MOS.RAM according to the present embodiment is the same as the conventional dynamic MOS.RAM shown in FIG. 1 except for a structure of a spare row decoder comprising a spare row main decoder 70 and spare row sub-decoders 60a and 60b and a structure of a spare column decoder 100. More specifically, structures of memory cell arrays 1a and 1b, a row main decoder 4 and a row sub-decoder 5, a selecting signal generating circuit 8 and a column decoder 9 are the same as those shown in FIGS. 2, 3, 5 and 6.

Referring to FIG. 10, two spare row main decoders 70 are provided with respect to four pairs of spare row sub-decoders 60a and 60b provided corresponding to four blocks #1 to #4. One of the spare row main decoders 70 is connected to the spare row sub-decoders 60a and 60b in the block #1 and the spare row sub-decoders 60a and 60b in the block #2 through a single spare decoder selecting line SL. In addition, the other spare row main decoder 70 is connected to the spare row sub-decoders 60a and 60b in the block #3 and the spare row sub-decoders 60a and 60b in the block #4 through a single spare decoder selecting line SL.

Figure 11:
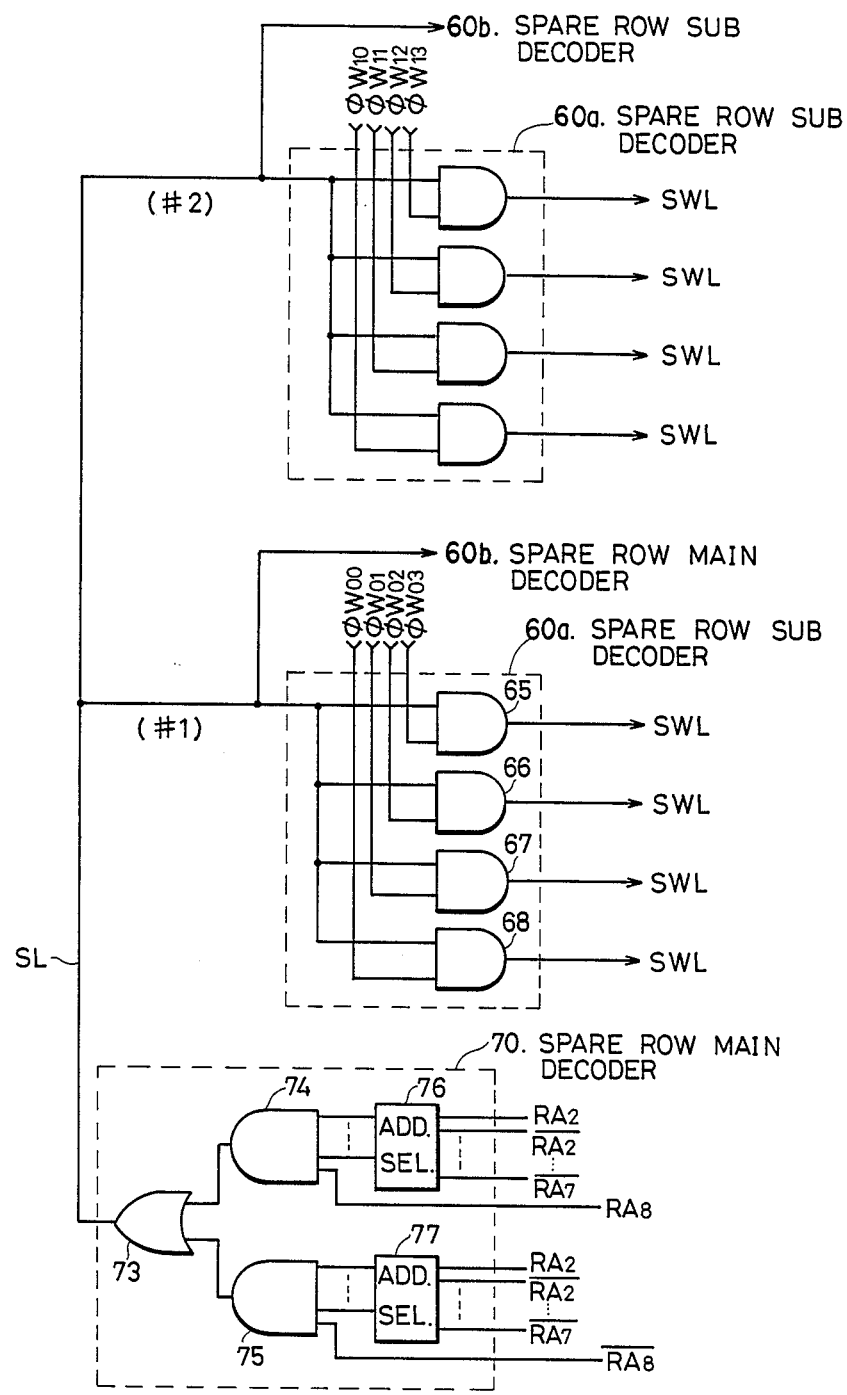
FIG. 11 is a circuit diagram showing structures of spare row main decoders and spare row sub-decoders included in the dynamic MOS.RAM shown in FIG. 10.

FIG. 11 is a diagram showing circuit structures of a spare row main decoder 70 and spare row sub-decoders 60a and 60b.

The spare row main decoder 70 comprises an OR circuit 73, two AND circuits 74 and 75 and two address selectors 76 and 77. Each of the address selectors 76 and 77 has a plurality of input terminals receiving row address signals RA$_2$, $\overline{RA_2}$, ..., RA$_7$, $\overline{RA_7}$, respectively, and a plurality of output terminals outputting row address signals RA$_2$ or $\overline{RA_2}$, ..., RA$_7$ or $\overline{Ra_7}$, respectively. Each of the address selectors 76 and 77 comprises a plurality of fuse-links, so that a row address signal provided to each of the output terminals is selected depending on whether the fuse-links are melted or not. Each of the address selectors 76 and 77 is set to output the same row address signal as that applied to a row main decoder 4 for selecting a column including a defective memory cell in each of the blocks. The AND circuit 74 has an input terminal receiving the row address signals outputted from the address selector 76 and a row address signal RA$_8$ serving as a block selecting signal. The AND circuit 75 has an input terminal receiving the row address signals outputted from the address selector 77 and a row address signal $\overline{RA_8}$ serving as a block selecting signal. Output signals from the AND circuits 74 and 75 are applied to input terminals of the OR circuits 73. The OR circuit 73 has an output terminal connected to a spare decoder selecting line SL.

One spare row sub-decoder 60a provided in the block #1 comprises four AND circuits 65 to 68. Each of the AND circuits 65 to 68 has one input terminal connected to the spare decoder selecting line SL. The AND circuits 65 to 68 have other input terminals receiving selecting signals $\Phi W_{00}$ to $\Phi W_{03}$ by a selecting signal generating circuit 8 provided in the block #1, respectively. The AND circuits 65 to 68 have output terminals connected to spare word lines SWL, respectively.

The other spare row sub-decoder 60b (now shown) provided in the block #1 has the same structure as that of the above described spare row sub-decoder 60a.

Spare row sub-decoders 60a and 60b provided in the block #2 have the same structures as those of the above described spare row sub-decoders 60a and 60b provided in the block #1. However, selecting signals $\Phi W_{10}$ to $\Phi W_{13}$ are applied to the spare row sub-decoders 60a and 60b in the block #2 by a selecting signal generating circuit 8 provided in the block #2. The spare row sub-decoders 60a and 60b in the block #2 are also connected to the spare decoder selecting line SL to which the spare row sub-decoders 60a and 60b in the block #1 are connected.

Description is now made on operation of the circuit shown in FIG. 11.

When all of the row address signals outputted from the address selector 77 attain an "H" level with RA$_8$ being equal to 0, the output of the AND circuit 75 attains "H" level. Therefore, the output of the OR circuit 73 attains the "H" level, so that the spare decoder selecting line SL is activated. At that time, the output of the AND circuit 74 is at a low level (an "L" level). Since RA$_8$ equals 0, one of the selecting signals $\Phi W_{00}$ to $\Phi W_{03}$ outputted from the selecting signal generating circuit 8 in the block #1 attains the "H" level. At that time, all of the selecting signals $\Phi W_{10}$ to W$_{13}$ outputted from the selecting signal generating circuit 8 in the block #2 remain at the "L" level. Thus, any of the spare word lines SWL connected to the spare row sub-decoders 60a and 60b in the block #1 is activated and any of the spare word lines SWL in the block #2 is not activated.

Although two spare decoder selecting lines are required with respect to the conventional spare row decoders in the blocks #1 and #2, only one spare decoder selecting line is required with respect to the spare row decoders according to the present embodiment, so that the chip size can be decreased and chip size is not so increased by the increase in number of spare decoders.

Figure 12:
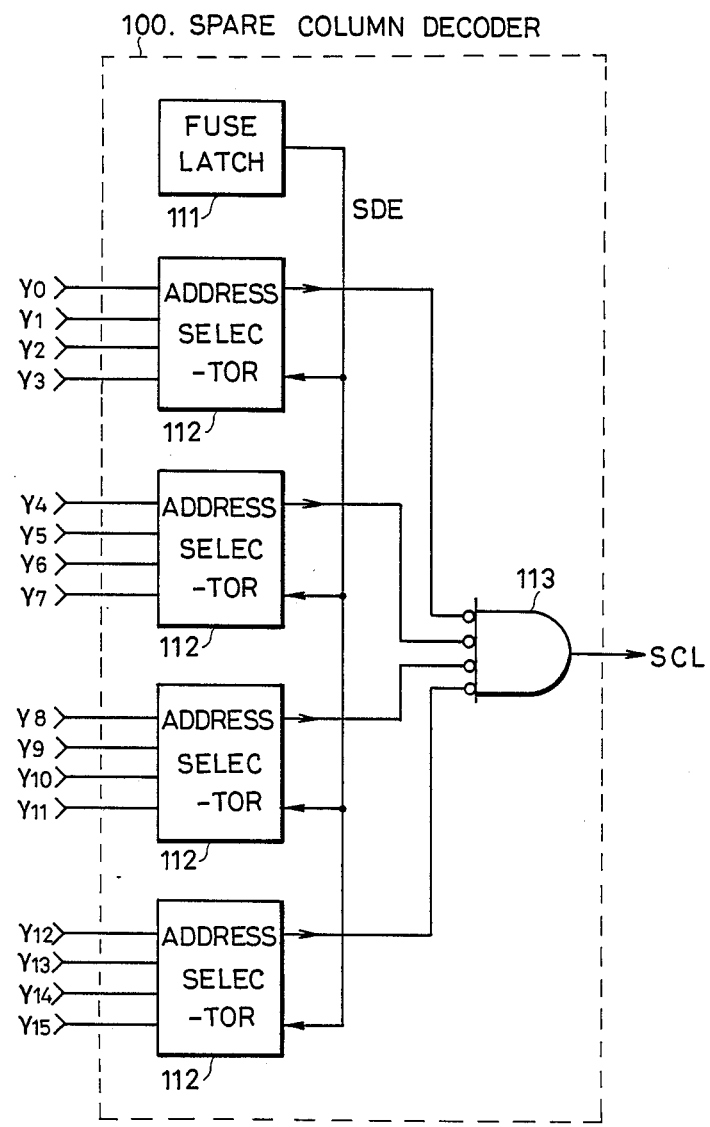
FIG. 12 is a circuit diagram showing a structure of one of spare column decoders included in the dynamic MOS.RAM shown in FIG. 10.

FIG. 12 is a diagram showing a circuit structure of a spare column decoder 100.

Figure 8:
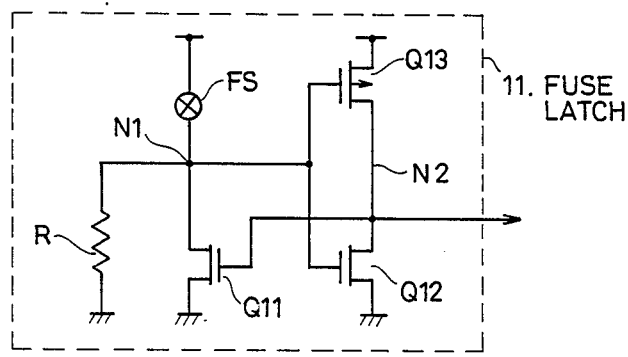
FIG. 8 is a circuit diagram showing a structure of a fuse latch included in the spare column decoder shown in FIG. 7.
Figure 9:
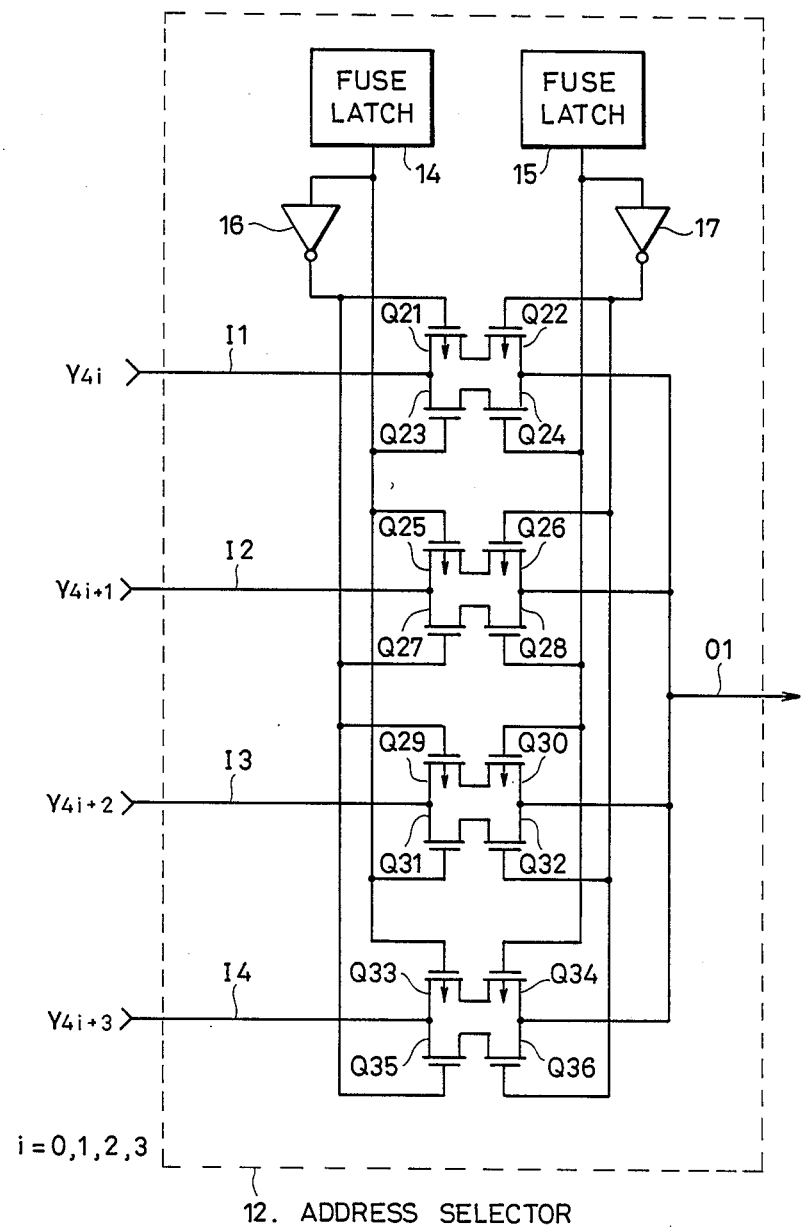
FIG. 9 is a circuit diagram showing a structure of one of address selectors included in the spare column decoders shown in FIG. 7.

The spare column decoder 100 comprises one fuse latch 111, four address selectors 112 and one AND circuit 113. The fuse latch 111 has the same structure as that shown in FIG. 8. When a fuse-link contained in the fuse latch 111 is not melted, the fuse latch 111 outputs a signal at an "L" level. When the fuse-link is melted, the fuse latch 111 outputs a signal at an "H" level. An output signal from the fuse latch 111 serves as an SDE (Spare Decoder Enable) signal showing whether or not a spare decoder is used. Each of the address selectors 112 comprises four input terminals receiving address signals, one output terminal and an SDE terminal receiving the above described SDE signal. Address signals Y$_0$ to Y$_3$, Y$_4$ to Y$_7$, Y$_8$ to Y$_{11}$ and Y$_{12}$ to Y$_{15}$ are applied to four address selectors 112, respectively. The AND circuit 113 has input terminals receiving output signals of the address selectors 112, respectively. The AND circuit 113 has an output terminal connected to a spare column selecting line SCL.

When the SDE signal from the fuse latch 111 attains the "H" level, each of the address selectors 111 provides to the output terminal any of the address signals applied to the four input terminals. Each of the address selectors 112 is set to output the same address signal as that applied to a column decoder 9 for selecting a column including a defective memory cell. When all of the output signals from the four address selectors 112 attain the "L" level, the AND circuit 113 renders the spare column selecting line SCL active.

Figure 13:
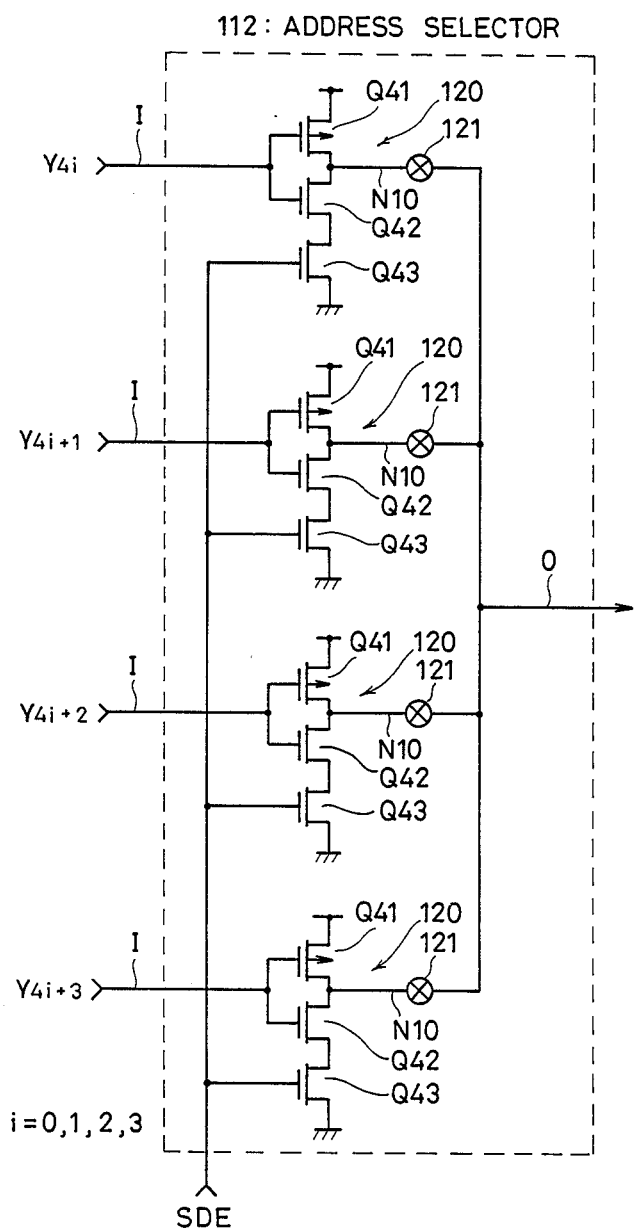
FIG. 13 is a circuit diagram showing a structure of one of address selectors included in the spare column decoder shown in FIG. 12.

FIG. 13 is a diagram showing a circuit structure of an address selector 112 shown in FIG. 12.

The address selector 112 comprises four buffer circuits 120 and four fuse-links 121. Each of the buffer circuits 120 comprises a P channel MOSFET Q41 and N channel MOSFETs Q42 and Q43. The MOSFET Q41 is connected between a power supply terminal and a node N10, and has a gate connected to an input terminal I. The MOSFETs Q42 and Q43 are connected in series between the node N10 and a ground terminal. The MOSFET Q42 has a gate connected to the input terminal I. The MOSFET Q43 has a gate receiving an SDE signal. Each of the fuse-links 121 is connected between each of the node N10 and an output terminal O.

In the address selector 112, when the SDE signal is at an "H" level, the MOSFETs Q43 are rendered conductive, so that address signals Y$_{4i}$ to Y$_{4i+3}$ applied to the input terminals I are inverted by inverters comprising the MOSFETs Q41 and Q42 and provided to the nodes N10. If the fuse-links 121 are not melted, the address signals of the nodes N10 are transmitted to the output terminal O. On the other hand, if the fuse-links 121 are melted, the address signals of the nodes N10 are not transmitted to the output terminal O. Thus, when three of the fuse-links 121 are melted in advance by a laser or the like, only an address signal applied to the input terminal I corresponding to the fuse-link 121 which is not melted is derived from the output terminal O.

When the spare column decoder 100 is not being used, the SDE signal SDE is at an "L" level, so that the MOSFETs Q43 in the buffer circuits 120 is rendered non-conductive. Thus, even if the address signals applied to the input terminals I attain an "H" level, potentials of the nodes N10 do not attain the "L" level and remain at the "H" level. As a result, an output signal at the "H" level is derived from the output terminal O. Therefore, when the SDE signal SDE is at the "L" level, an output signal of an NOR circuit 113 attains the "L" level, so that a spare column selecting line SCL is not activated.

Figure 14:
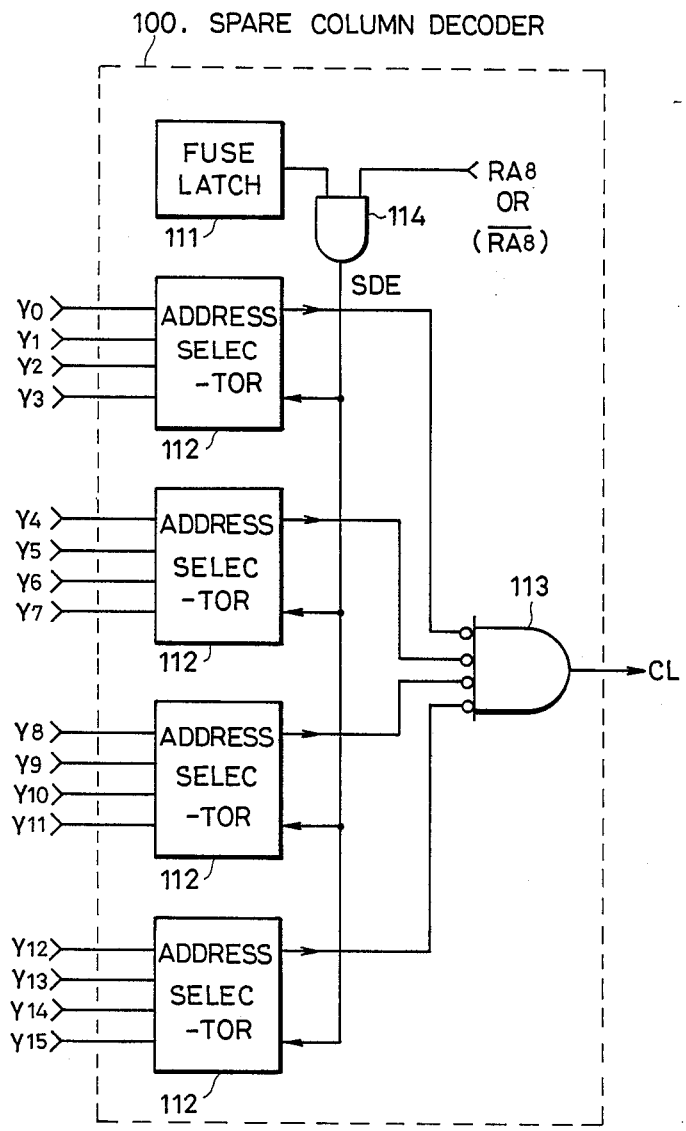
FIG. 14 is a circuit diagram showing another embodiment of the spare column decoder included in the dynamic MOS.RAM shown in FIG. 10.

FIG. 14 is a diagram showing a circuit structure according to another embodiment of the spare column decoder 100.

Referring to FIG. 14, an AND circuit 114 has one input terminal receiving an output signal from a fuse latch 111 and other input terminal receiving a row address signal $RA_8$ or $\overline{RA_8}$. An output signal from the AND circuit 114 is applied to address selectors 112 as an SDE signal SDE. The spare column decoder 100 according to the present embodiment is selected only when $RA_8$ equals either "1" or "0".

Figure 15A:
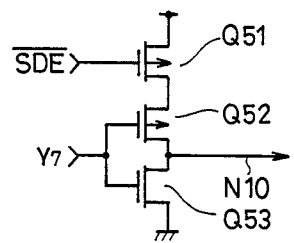
FIGS. 15A, 15B and 15C are circuit diagrams showing another example of one of buffer circuits included in the address selector shown in FIG. 13.
Figure 15B:
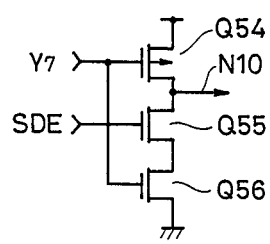
Figure 15C:
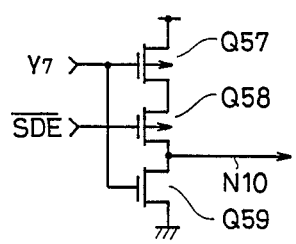

FIGS. 15A to 15C are circuit diagrams showing other examples of one buffer circuits 120 included in an address selector 112.

Referring to FIG. 15A, P channel MOSFETs Q51 and Q52 and an N channel MOSFET Q53 are connected in series between a power supply terminal and a ground terminal. The MOSFET Q51 has a gate receiving an inverted signal $\overline{SDE}$ of the SDE signal SDE. Each of the MOSFETs Q52 and Q53 has a gate receiving, for example, an address signal $Y_7$. A node of the MOSFETs Q52 and Q53 is connected to a node N10. When the inverted signal $\overline{SDE}$ is at an "L" level, the MOSFET Q51 is rendered conductive, so that the address signal $Y_7$ is inverted by an inverter comprising the MOSFETs Q52 and Q53 and derived from the node N10.

Referring to FIG. 15B, a P channel MOSFET Q54 and N channel MOSFETs Q55 and Q56 are connected in series between a power supply terminal and a ground terminal. The MOSFET Q55 has a gate receiving an SDE signal SDE. Each of the MOSFETs Q54 and Q56 has a gate receiving, for example, an address signal $Y_7$. A node of the MOSFETs Q54 and Q55 is connected to the node N10. When the SDE signal SDE is at an "H" level, the MOSFET Q55 is rendered conductive, so that the address signal $Y_7$ is inverted by an inverter comprising the MOSFETs Q54 and Q56 and derived from the node N10.

Referring to FIG. 15C, P channel MOSFETs Q57 and Q58 and an N channel MOSFET Q59 are connected in series between a power supply terminal and a ground terminal. The MOSFET Q58 has a gate receiving an inverted signal $\overline{SDE}$ of the SDE signal SDE. Each of the MOSFETs Q57 and Q59 has a gate receiving, for example, an address signal $Y_7$. A node of the MOSFETs Q58 and Q59 is connected to the node N10. When the inverted signal $\overline{SDE}$ is at an "L" level, the MOSFET Q58 is rendered conductive, so that the address signal $Y_7$ is inverted by an inverter comprising MOSFETs Q57 and Q59 and derived from the node N10.

As described in the foregoing, the address selector 112 according to the above described embodiment comprises only buffer circuits 120 and fuse-links 121, and does not have fuse latches 14 and 15 unlike the conventional address selector 12, so that the size of a spare decoder is reduced and the chip size is decreased.

The spare row main decoder, the spare row subdecoder and the spare column decoder according to the above described embodiment can be applied to any of a spare row decoder and a spare column decoder in a dynamic RAM, and also applied to a spare decoder in a static RAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a programmable redundancy circuit, comprising:

a plurality of memory cells and at least one spare memory cell, block selecting means for generating a block selecting signal and a block non-selecting signal, each of said memory cell array blocks being selected by said block selecting signal and not selected by said block non-selecting signal, a plurality of decoders each provided in each of said memory cell array blocks and responsive to address signals for selecting any of said memory cells, a plurality of spare sub-decoders each provided in each of said memory cell array blocks for selecting spare memory cell in place of a defective memory cell when said defective memory cell exists in said memory cells, a spare main decoder arranged outside said memory cell array blocks, said spare main decoder being responsive to an address signal corresponding to a defective memory cell in a selected memory cell array block and the block selecting signal for generating a spare decoder selection signal, and a spare decoder selecting line connected between said spare main decoder and said memory cell array block selected by said block selecting signal and said memory cell array block non-selected by said block non-selecting signal for transmitting said spare decoder selecting signal generated by said spare main decoder to said selected and nonselected memory cell array blocks, said spare sub-decoders being activated by said spare decoder selecting signal.

2. A semiconductor memory device according to claim 1, wherein said spare main decoder comprises a plurality of decoder means, the number of which is the same as that of said memory cell array blocks corresponding to said spare sub-decoders to which said spare main decoder is connected through said spare decoder selecting line, each of said decoder means comprising address selecting means having a plurality of input terminals receiving a plurality of address signals and a plurality of output terminals outputting said address signal to be applied to some of said plurality of input terminals which are programmed in advance, and first logical circuit means responsive to a predetermined combination of said address signals outputted from said address selecting means and said block selecting signal for generating said spare decoder selecting signal, and second logical circuit means for driving said spare decoder selecting signals outputted from said plurality of decoder means to said spare decoder selecting line.

3. A semiconductor memory device according to claim 2, wherein
   each of said memory cell array blocks comprise a plurality of memory cells arranged in a plurality of columns and rows and a plurality of spare memory cells arranged in at least one of at least one column and at least one row,
   said plurality of decoders comprise a plurality of column decoders for selecting at least one column in each of said memory cell array blocks and a plurality of row decoders for selecting at least one row in each of said memory cell array blocks, and
   said plurality of spare sub-decoders comprise spare column sub-decoders for selecting spare memory cells arranged in at least one column in each of said memory cell array blocks or spare row sub-decoders for selecting spare memory cells arranged in said at least one row in each of said memory cell array blocks.

4. A semiconductor memory device according to claim 2, wherein
   said address selecting means comprises a plurality of link elements capable of being disconnected for programming in advance depending on whether said link elements are disconnected.

5. A semiconductor memory device according to claim 3, wherein
   said address selecting means comprises a plurality of link elements capable of being disconnected for programming in advance depending on whether said link elements are disconnected.

6. A semiconductor memory device according to claim 4, wherein
   said link elements is arranged to be meltable by a laser.

7. A semiconductor memory device including a programmable redundancy circuit, comprising:
   a memory cell array comprising a plurality of memory cells arranged in selectable blocks and at least one spare memory cell,
   a decoder responsive to an address signal for selecting any of said memory cells, and
   a spare decoder responsive to an address signal corresponding to a defective memory cell for selecting said spare memory cell when said defective memory cell exists in said memory cells,
   said spare decoder comprising a plurality of address selecting means and decoder means responsive to a predetermined combination of outputs of said plurality of address selecting means and block selection and non-selection signals for generating a selecting signal for selecting said spare memory cell,
   each of said address selecting means comprising
      a plurality of buffer circuits receiving different address signals,
      an output terminal, and
      a plurality of link element means each connected between each of said buffer circuits and said output terminal for selectively disconnecting ones of said buffer circuits from said output terminal.

8. A semiconductor memory device according to claim 7, wherein
   said spare decoder further comprises enable signal generating means comprising a link element capable of being disconnected for permitting generation of an enable signal when the link element are melted, and
   each of said buffer circuits is activated by said enable signal.

9. A semiconductor memory device according to claim 8, wherein each of said buffer circuits comprises
   an inverter comprising a first transistor and a second transistor, and
   a third transistor responsive to said enable signal for supplying power to said inverter.

10. A semiconductor memory device according to claim 9, wherein
    said first transistor has one conduction terminal coupled to a power-supply potential, other conduction terminal coupled to said link element and a control terminal coupled to said address signal,
    said second transistor has one conduction terminal coupled to said link element, other conduction terminal and a control terminal coupled to said address signal, and
    said third transistor has one conduction terminal coupled to said other conduction terminal of said second transistor, other conduction terminal coupled to a ground potential and a control terminal coupled to said enable signal.

11. A semiconductor memory device according to claim 9, wherein
    said first transistor has one conduction terminal, other conduction terminal coupled to said link element and a control terminal coupled to said address signal,
    said second transistor has one conduction terminal coupled to said link element, other conduction terminal coupled to a ground potential and a control terminal coupled to said address signal, and
    said third transistor has one conduction terminal coupled to a power-supply potential, other conduction terminal coupled to said one conduction terminal of said first transistor and a control terminal coupled to said enable signal.

12. A semiconductor memory device according to claim 9, wherein
    said first transistor has one conduction terminal coupled to a power-supply potential, other conduction terminal coupled to said link element and a control terminal coupled to said address signal,
    said second transistor has one conduction terminal, other conduction terminal coupled to a ground potential and a control terminal coupled to said address signal, and
    said third transistor has one conduction terminal coupled to said link element, other conduction terminal coupled to said one conduction terminal of said second transistor and a control terminal coupled to said enable signal.

13. A semiconductor memory device according to claim 9, wherein
    said first transistor has one conduction terminal coupled to a power-supply potential, other conduction terminal and a control terminal coupled to said address signal,
    said second transistor has one conduction terminal coupled to said link element, other conduction terminal coupled to a ground potential and a control terminal coupled to said address signal, and
    said third transistor has one conduction terminal connected to said other conduction terminal of said first transistor, other conduction terminal coupled to said link element and a control terminal coupled to said enable signal.

14. A semiconductor memory device according to claim 7, wherein
said decoder means comprises logical circuit means, said logical circuit means comprising
a plurality of input terminals coupled to output signals from said address selecting means, respectively, and
an output terminal means responsive to a predetermined combination of said output signals applied to said plurality of input terminals for outputting said selecting signal.

15. A semiconductor memory device according to claim 8, wherein
said decoder means comprises logical circuit means, said logical circuit means comprising
a plurality of input terminals coupled to output signals from said address selecting means, respectively, and
an output terminal means responsive to a predetermined combination of said output signals applied to said plurality of input terminals for outputting said selecting signal.

16. A semiconductor memory device according to claim 8, wherein
said memory cell array comprises a plurality of memory cell array blocks each comprising a plurality of memory cells and at least one spare memory cell, each of said memory cell array blocks being selectively operated by a block selecting signal,
said decoder and said spare decoder are provided for each of said memory cell array blocks, and
said enable signal generating means is responsive to said block selecting signal for generating said enable signal.

17. A semiconductor memory device according to claim 7, wherein
said link element is arranged to be meltable by a laser or the like.

18. A semiconductor memory device according to claim 8, wherein
said link element is arranged to be meltable by a laser or the like.

* * * * *

UNITED STATES PATENT AND TRADEMARK OFFICE
CERTIFICATE OF CORRECTION

PATENT NO. : 4,837,747
DATED : June 6, 1989
INVENTOR(S) : Katsumi DOSAKA et al.

It is certified that error appears in the above-identified patent and that said Letters Patent is hereby corrected as shown below:

Column 12, line 14, before "a" insert --a plurality of memory cell array blocks each comprising--.

Signed and Sealed this

Ninth Day of June, 1998

Attest:

BRUCE LEHMAN

Attesting Officer    Commissioner of Patents and Trademarks